(12) United States Patent
Yoon et al.

(10) Patent No.: US 9,601,189 B2
(45) Date of Patent: Mar. 21, 2017

(54) REPRESENTING DATA USING A GROUP OF MULTILEVEL MEMORY CELLS

(71) Applicant: Hewlett-Packard Development Company, L.P., Houston, TX (US)

(72) Inventors: Doe Hyun Yoon, Palo Alto, CA (US); Jichuan Chang, Palo Alto, CA (US); Naveen Muralimanohar, Palo Alto, CA (US); Robert Schreiber, Palo Alto, CA (US); Norman P. Jouppi, Palo Alto, CA (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 14/784,136

(22) PCT Filed: Apr. 24, 2013

(86) PCT No.: PCT/US2013/037971
§ 371 (c)(1),
(2) Date: Oct. 13, 2015

(87) PCT Pub. No.: WO2014/175877
PCT Pub. Date: Oct. 30, 2014

(65) Prior Publication Data
US 2016/0078930 A1     Mar. 17, 2016

(51) Int. Cl.
| | | |
|---|---|---|
| *G11C 13/00* | (2006.01) | |
| *G11C 11/56* | (2006.01) | |
| *G11C 29/42* | (2006.01) | |
| *G11C 29/52* | (2006.01) | |
| *G11C 29/00* | (2006.01) | |
| *G06F 11/07* | (2006.01) | |
| *G06F 11/10* | (2006.01) | |

(52) U.S. Cl.
CPC ........ *G11C 11/5678* (2013.01); *G06F 11/073* (2013.01); *G06F 11/0793* (2013.01); *G06F 11/1004* (2013.01); *G11C 11/56* (2013.01); *G11C 13/0004* (2013.01); *G11C 13/0069* (2013.01); *G11C 29/42* (2013.01); *G11C 29/52* (2013.01); *G11C 29/70* (2013.01); *G11C 29/76* (2013.01); *G11C 2211/5647* (2013.01)

(58) Field of Classification Search
CPC .................................................. G11C 13/0004
USPC ....................................................... 365/163
See application file for complete search history.

(56) References Cited

U.S. PATENT DOCUMENTS

| | | | |
|---|---|---|---|
| 6,847,550 B2* | 1/2005 | Park ................. | G11C 11/5628 365/185.03 |
| 7,596,023 B2* | 9/2009 | Magnavacca ....... | G11C 11/5628 365/168 |
| 7,889,545 B2 | 2/2011 | Lee et al. | |

(Continued)

OTHER PUBLICATIONS

Handling Resistance Drift in Phase Change Memory—Device, Circuit, Architecture, and System Solutions, (Web Page), Retrieved Oct. 9, 2015, 19 pages, Awasthi et al.

(Continued)

*Primary Examiner* — Son Mai
(74) *Attorney, Agent, or Firm* — Trop, Pruner & Hu, P.C.

(57) ABSTRACT

A memory device includes a group or block of k-level memory cells, where k>2, and where each of the k-level memory cells has k programmable states represented by respective resistance levels.

19 Claims, 9 Drawing Sheets

(56) References Cited

U.S. PATENT DOCUMENTS

| | | |
|---|---|---|
| 8,737,139 B2* | 5/2014 | Moschiano ............ G11C 16/10 |
| | | 365/185.18 |
| 2003/0041299 A1 | 2/2003 | Kanazawa et al. |
| 2008/0055987 A1* | 3/2008 | Ruf ..................... G06F 11/1072 |
| | | 365/185.09 |
| 2009/0003046 A1 | 1/2009 | Nirschl et al. |
| 2009/0013223 A1 | 1/2009 | Lam |
| 2009/0103350 A1 | 4/2009 | Kund |
| 2011/0252188 A1 | 10/2011 | Weingarten |
| 2012/0278651 A1 | 11/2012 | Muralimanohar et al. |

OTHER PUBLICATIONS

International Searching Authority, The International Search Report and the Written Opinion, Jan. 22, 2014, 11 Pages.

Papandreou, N. et al., Drift-tolerant Multilevel Phase-change Memory, (Research Paper), May 22-25, 2011, 4 Pages.

Zhang, W. et al., Helmet: A Resistance Drift Resilient Architecture for Multi-level Cell Phase Change Memory System, (Research Paper), 41st International Conference on Dependable Systems & Networks, Jun. 27-30, 2011, pp. 197-208.

* cited by examiner

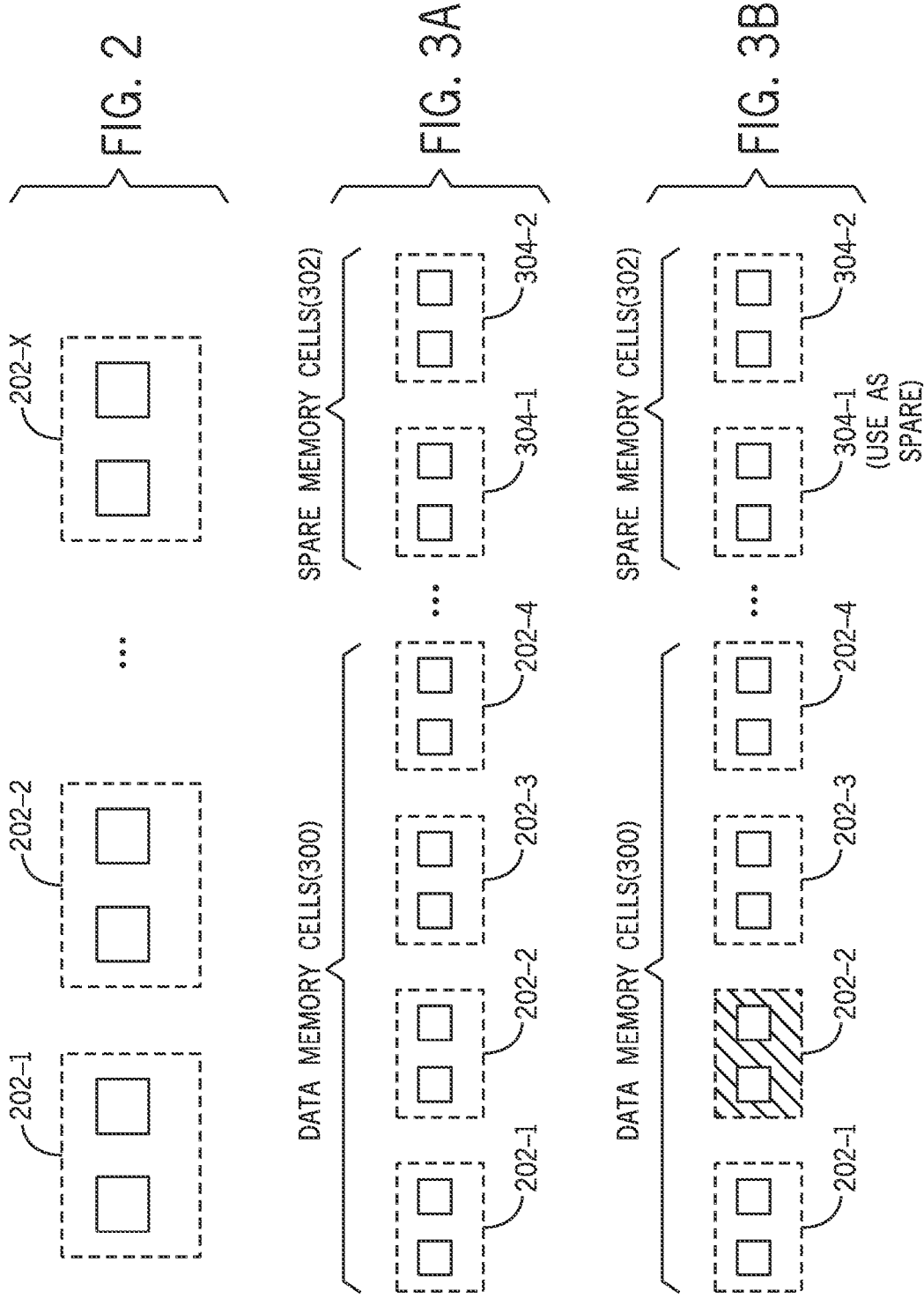

REPRESENTING DATA USING A GROUP OF MULTILEVEL MEMORY CELLS

BACKGROUND

To achieve increased memory density, phase change memories can be used. The memory cells of a phase change memory can each have multiple states that correspond to different resistances. A memory cell of a phase change memory is effectively a variable resistor, which can be formed of chalcogenide glass, for example. To write to a phase change memory cell, the cell is heated, which melts the material, which is then cooled. The rate of cooling controls the crystal size of the resulting solid material, which controls the resistance. A relatively slow cooling rate promotes crystallization, which leads to reduced resistance of the memory cell.

A phase change memory cell can be a multilevel memory cell that can represent more than two states. The number of states is represented by a corresponding number of resistance levels to which the memory cell can be programmed.

BRIEF DESCRIPTION OF THE DRAWINGS

Some embodiments are described with respect to the following figures:

FIG. 2 is a schematic diagram of groups of multilevel memory cells, according to some implementations;

FIGS. 3A-3B are schematic diagrams of groups of multilevel memory cells that include data memory cells and spare memory cells, according to some implementations;

DETAILED DESCRIPTION

Figure 1:
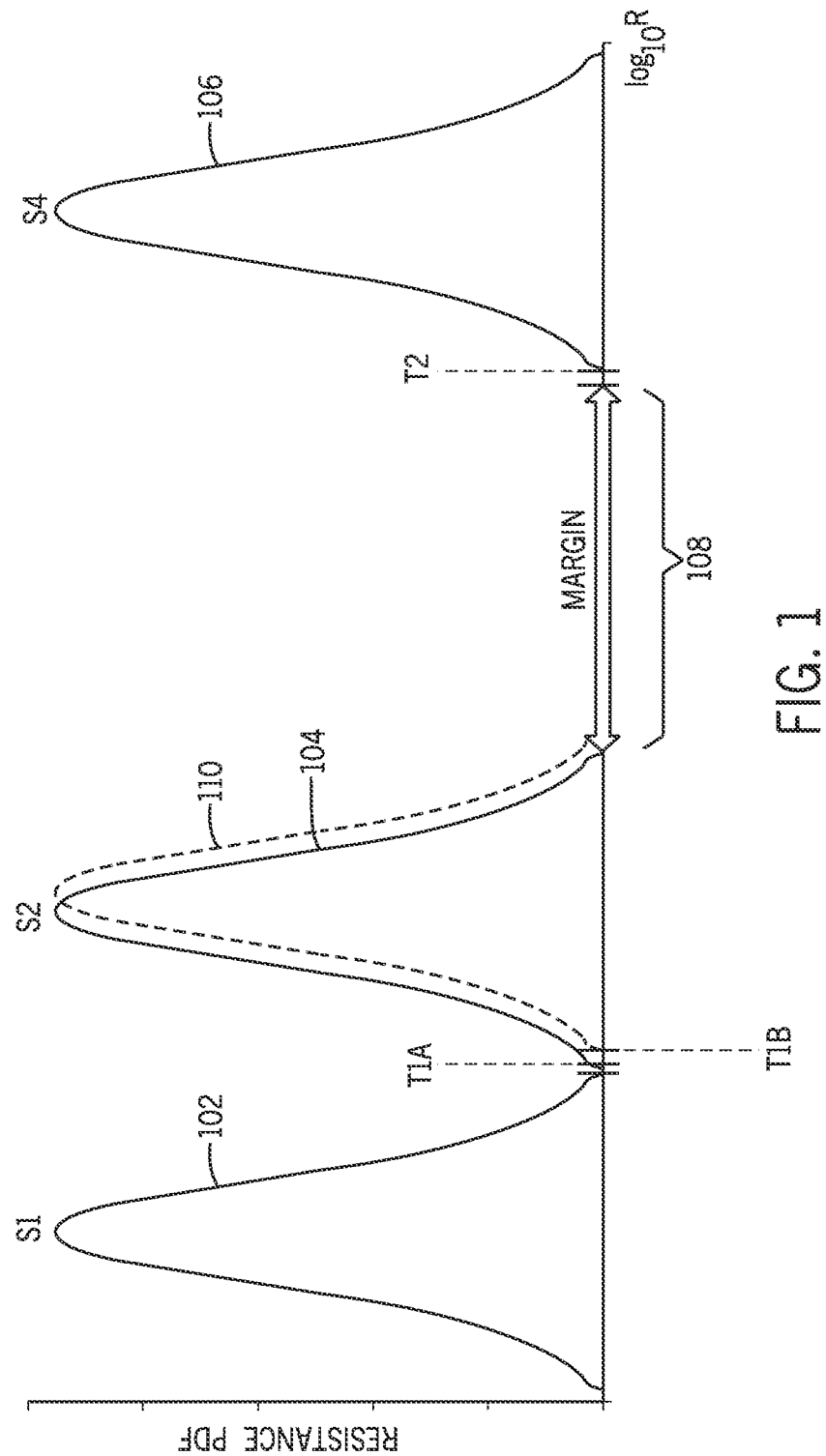
FIG. 1 is a graph illustrating different states of a multilevel memory cell according to some implementations.

During a write of a phase change memory cell, the resistance level of the memory cell is controlled by the rate of cooling of the memory cell after the memory cell has been heated and the material of the memory cell has melted. The resistance level of the memory cell determines the data state represented by the memory cell. In some implementations, each memory cell of a phase change memory device is able to represent more than two states. More generally, such a memory cell can be referred to as a k-level memory cell, where k>2.

Although reference is made to phase change memories in this discussion, it is noted that techniques or mechanisms according to some implementations can be applied to other types of memories that employ resistance levels to represent respective data states. Another example of such a memory is a memristor memory.

An issue associated with a phase change memory device for any other memory device that uses resistance levels to represent data states) is that the resistance programmed into a memory cell is not constant over time. In fact, the memory cell resistance can drift over time. The drift in resistance can be caused by various factors, including heat created due to writing of nearby memory cells, or other factors. The resistance drift, if unchecked, can eventually lead to data error. For example, a particular resistance level of a multilevel memory cell may initially represent a first data state. Over time, due to resistance drift, the resistance of the memory cell can increase, which can cause the resistance to rise to a level that corresponds to a second data state, which leads to data error.

To address data error due to resistance drift, refresh of memory cells in a phase change memory device can be performed, where the state of each memory cell is read and the memory cell's resistance is restored to the correct level. An issue associated with performing refresh (if done frequently) is that the refresh consumes power, and also consumes memory access cycles (which leads to reduced memory bandwidth).

The resistance drift of memory cells can grow with time. The growth rate of the resistance drift depends on the resistance of the memory cell, and is larger for states represented by higher resistance levels.

One type of phase change memory device employs four-level memory cells, where each memory cell can represent four distinct data states. The four different states are represented by four corresponding different resistance levels. The four states can be referred to as S1, S2, S3, and S4, which correspond to resistance levels R1, R2, R3, and R4, where R1<R2<R3<R4. A four-level memory cell can thus represent two binary data bits.

In such examples, the state S4 that is associated with the highest resistance level, R4, does not suffer from resistance drift, since resistance drift causes resistance to increase over time, and any resistance level over some specified threshold is considered to represent state S4. However, state S3, represented by resistance level R3, can be affected most by resistance drift. Since resistance drift is greater for higher resistance levels, the resistance R3 can more quickly grow to a level that exceeds the specified threshold between S3 and S4. In other words, as the resistance level R3 drifts over time, it can increase such that it becomes representative of state S4 rather than state S3. State S2, which is represented by resistance level R2, can also be affected by resistance drift, although to a somewhat lesser extent than state S3. State S1 suffers even less resistance drift, since state S1 is associated with a relatively low resistance and thus the resistance drift for state S1 over time is relatively small, and can even be negligible.

In accordance with some implementations, to address the resistance drift issue, instead of using a four-level memory cell, a three-level memory cell can be used in some examples. More specifically, state S3 can be omitted, since state S3 is associated with the resistance level, R3, that suffers more from resistance drift. FIG. 1 shows an example three-level memory cell in which states S1, S2, and S4 are used, but state S3 is not used. Two thresholds T1 and T2 are defined in FIG. 1, where any resistance level that is less than T1 corresponds to state S1, and any resistance level greater than T2 corresponds to state S4. Any resistance between T1 and T2 represents state S2.

The actual resistance that is written to a phase change memory cell during a write operation is a random variable whose distribution is log-normal, as represented by curves 102, 104, and 106 in FIG. 1. In the graph of FIG. 1, the horizontal axis is a logarithm of the resistance ($\log_{10} R$), while the vertical axis represents the probability distribution function (PDF) of the resistance R. The resistance written to a memory cell has a normal distribution, including a mean at or close to a nominal value, and a standard deviation from the mean.

As depicted in FIG. 1, since the S3 state is not used, a relatively wide margin represented as 108 is provided between states S2 and S4, such that state S2 can tolerate a relatively large amount of resistance drift over time without leading to data error. As noted above, state S1 suffers relatively low resistance drift, which may even be negligible.

Removing state S3 from being represented by a multilevel memory cell means that fewer data states can be represented, which reduces the average number of data bits per memory cell that can be represented in the phase change memory device. Although a multilevel memory cell that is capable of storing four states can represent two data bits per memory cell, it is noted that the issue of resistance drift may make such a configuration impractical. To store two bits per memory cell, more frequent refresh operations may have to be performed to refresh the resistance levels of the memory cells to avoid errors due to resistance drift.

By removing the most vulnerable state (S3), average error rates can be reduced, and refresh operations can be performed less frequently or even avoided.

Although FIG. 1 shows example target nominal values (represented by the top of each of the curves 102, 104, and 106), it is noted that in other examples, the target resistance values for each particular state (and especially state S2) can be adjusted, such as by moving the target resistance value for state S2 closer to the threshold T2 between states S2 and S4, as indicated by dashed curve 110. For curve 104, the threshold between states S1 and S2 is T1A, while for curve 110, the threshold between states S1 and S2 is T1B, which is greater than T1A.

Although FIG. 1 depicts an example of a three-level memory cell, it is noted that more generally, a k-level (k>2) memory cell can be used.

In addition to removing a vulnerable state from use for each memory cell, techniques or mechanisms according to some implementations also provide for groups of memory cells. For example, each group can include two memory cells, where each memory cell is a three-level memory cell. Such an arrangement is referred to as a 3-on-2 arrangement. FIG. 2 shows multiple groups 202-1, 202-2, 202-X of memory cells, where each group 202-*i* (i=1 to X) includes two memory cells (represented by squares in FIG. 2). Each memory cell is a three-level memory cell that is capable of representing three respective states. Accordingly, each group 202-*i* of memory cells in the 3-on-2 arrangement can represent three data bits. An example 3-on-2 data encoding scheme is depicted in the table below:

| Cell states [cell 1, cell 2] | 3-bit data |
|---|---|
| S1, S1 | 000 |
| S1, S2 | 001 |

-continued

| Cell states [cell 1, cell 2] | 3-bit data |
|---|---|
| S1, S4 | 010 |
| S2, S1 | 011 |
| S2, S2 | 100 |
| S2, S4 | 101 |
| S4, S1 | 110 |
| S4, S2 | 111 |
| S4, S4 | METADATA |

In the table above, the first column includes states of cell 1 and cell 2 in a group 202-*i*. Thus, if cell 1 has state S1 and cell 2 has state S1 (first row of the table above), then the 3-bit data that is represented is 000. Similarly, if cell 1 has state S2 and cell 2 has state S1, then the 3-bit data that is represented is 011.

In the table above, note that one of the state combinations, specifically (S4, S4), corresponds to a metadata state. The metadata state represented by (S4, S4) includes information other than actual data that is written to the phase change memory. For example, the metadata represented by (S4, S4) can indicate that the group 202-*i* of memory cells does not represent valid data. In such examples, the metadata state is an invalid state, to indicate that data in the group 202-*i* of memory cells is invalid. In other examples, the metadata state can be used to represent other information. Although just one metadata state is shown in the example above, it is noted that in other implementations, multiple metadata states can be associated with each group 202-*i* of memory cells.

Also, although (S4, S4) is used to represent the metadata state, it is noted that another state combination can be used to represent the metadata state. Also, a group of memory cells can represent multiple metadata states in other examples.

More generally, instead of a 3-on-2 arrangement, an m-on-n arrangement can be used, where a group of n k-level memory cells can represent a total of $k^n$ states. The n k-level cells within a group 202-*i* can represent an m-bit data, assuming that $k^n$ is greater than or equal to $2^m$. In some implementations, the value of k is a value that is not a power of 2. In implementations where k is not a power of 2 (in other words, $k \neq 2^i$, where i is a natural number), then $k^n$ cannot be equal to $2^m$. In such implementations, $k^n > 2^m$, which means that a group of n k-level memory cells cannot use all the states, such that the unused state(s) can be metadata state(s). If the group of n k-level memory cells is in one of the metadata state(s), then that is an indication that the group does not store actual data. Rather, the metadata state(s) can be used to indicate other information, such as for identifying that the group of memory cells is faulty and should not be used, for indicating a data cache status (e.g. that the data corresponding to this group of memory cells is exclusively cached by a processor and is not to be used by any other processor in a multiprocessor system), or other types of information.

Generally, note that a group 202-*i* of multilevel memory cells is able to represent data having a number of bits that is greater than the number of cells in the group. Moreover, the group 202-*i* of multilevel memory cells is able to represent at least one metadata state.

In some implementations, a phase change memory device can include spare memory cells in addition to data memory cells. A data memory cell is used by the phase change memory device to store data. A spare memory cell is not initially used by the phase change memory device, unless an error or fault is detected in the phase change memory device, in which case the spare memory cell can be re-configured as a data memory cell for use in storing data.

FIG. 3A shows an example that includes data memory cells 300 and spare memory cells 302. In the specific example of FIG. 3A, it is assumed that there are four spare memory cells for eight data memory cells. In other examples, other numbers of data memory cells and spare memory cells can be employed.

The eight data memory cells 300 are arranged in four groups 202-1, 202-2, 202-3, and 202-4. The Four spare memory cells 302 are arranged in two groups 304-1 and 304-2.

If a fault is detected in at least one memory cell of the group 202-2, for example, then the group 202-2 can be programmed to the invalid state, as indicated with the hashed pattern in FIG. 3B. Programming the group 202-2 to the invalid state (e.g. S4, S4) is an indication that the group 202-2 does not contain valid data, and thus, should not be used. As depicted in FIG. 3B, after marking the group 202-2 as invalid, one of the spare groups, e.g. 304-1, can be used as a replacement for the group 202-2 to store data.

As discussed above, the invalid state (or more generally the metadata state) of a group of memory cells is represented with the (S4, S4) state combination by the memory cells in the group. A phase change memory device can have two types of failure modes: stuck-reset and stuck-set. A memory cell in the stuck-reset state is a memory cell that is stuck at the highest resistance state (S4). Thus, when a memory cell experiences a stuck-reset failure, the group containing this memory cell that is in the stuck-reset mode can be naturally programmed to the invalid state (S4, S4).

The other failure mode is the stuck-set failure mode. A memory cell in the stuck-set failure mode refers to a memory cell that cannot be reset to the highest resistance state (S4) using normal write operations. The memory cell state remains at a lower resistance state, e.g. S1 or S2. To revive a stuck-set memory cell, a reset write pulse that has a larger amplitude and longer duration than normally used in a write operation can be applied, to convert the stuck-set memory cell to the S4 state.

The example of FIGS. 3A-3B depict how a hard error (caused by a hardware failure such as a wear-out failure, for example) in a memory cell can be corrected, by use of a spare group of memory cells.

Figure 4:
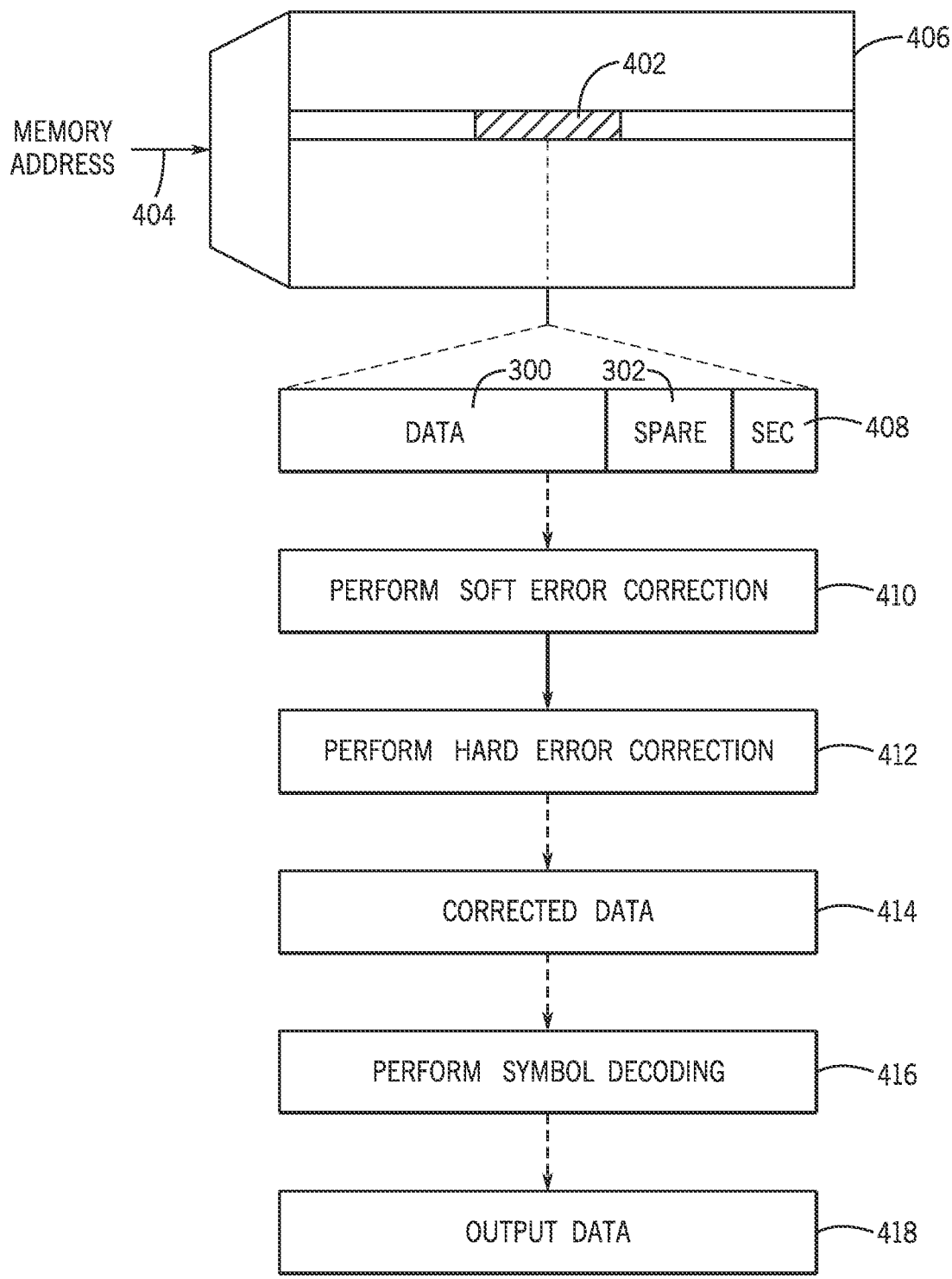
FIG. 4 is a flow diagram of reading multilevel memory cells according to some implementations.

FIG. 4 is a flow diagram for accessing a block of data (402) in response to a memory address 404. The block 402 is part of an array of memory cells 406. The block 402 includes the data memory cells 300 and spare memory cells 302, such as depicted in FIG. 3A. In addition, the block 402 also includes memory cells 408 for storing an error code for correcting a soft error in data contained in the data memory cell 300 and spare memory cells 302.

In a specific example of a 3-on-2 arrangement, a 512-bit data can be stored in the memory array 406 using 342 memory cells. To correct a single-bit error for a 512-bit data, a 10-bit single-bit correcting (SEC) code can be used. In some examples, the SEC code can be a BCH code or other type of code. The memory cells 408 for storing the error code can be single-level cells, rather than multilevel cells. However, in other examples, multilevel memory cells can be used to store the error code. Although reference is made to data having a specific number of bits and an error code having a specific number of bits, it is noted that techniques or mechanisms according to some implementations can be applied to other data lengths and corresponding error code lengths.

In some examples, the SEC code is based on using two-bit Gray coding for each memory cell, where the Gray coding performs the following mapping: 00 for state S1, 01 for state S2, and 11 for state S4. By using Gray coding, a soft error, such as due to resistance drift, manifests as a 1-bit error, so that the SEC code can correct an error that converts a valid state (S1 or S2) to an invalid state (S4).

If a soft error is detected, then soft error correction is performed (at 410) using the SEC code. After the soft error correction is performed, hard error correction can be performed (at 412), such as by replacing a faulty data memory group (if present) with a spare memory group, such as according to the FIG. 3B example. The soft error correction is performed before the hard error correction since a drift error may change a valid state into an invalid state, which can cause an incorrect hard error correction.

As further shown in FIG. 4, after any hard error correction is applied (at 412), corrected data (414) is subjected to symbol decoding (at 416) to convert the states represented by the two memory cells in each group to the corresponding 3-bit data. After performing the symbol decoding, output data (418) is provided.

Figure 5:
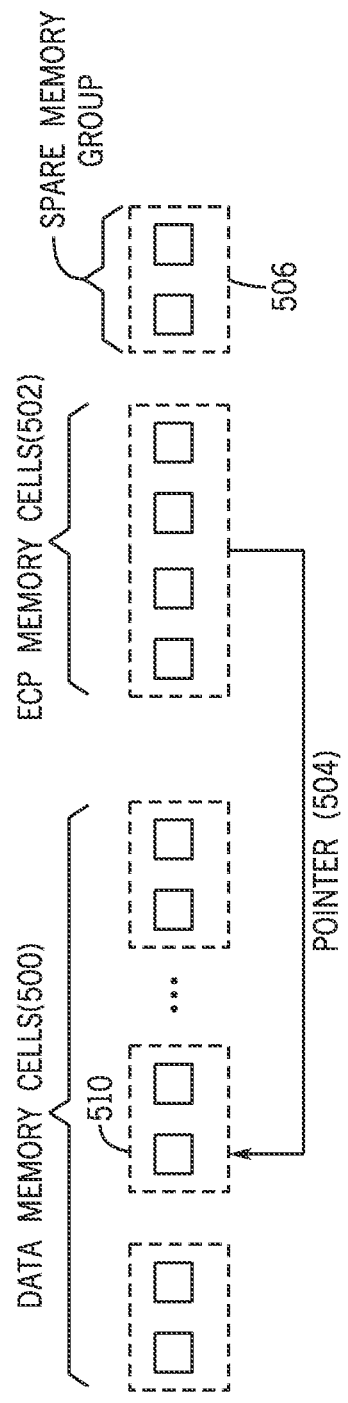
FIG. 5 is a schematic diagram of groups of memory cells including a data recovery mechanism according to some implementations.

In other examples, instead of using the arrangement as depicted in FIGS. 3A and 3B to perform hard error correction, an error correcting pointer (ECP) technique or mechanism can be used. As shown in FIG. 5, ECP memory cells 502 are used to store a pointer 504 to a faulty data memory group 510 (e.g. 3-on-2 group or more generally m-on-n group) of the data memory cells 500. The faulty data memory group 510 has at least one faulty memory cell. The ECP memory cells 502 contain a value, which is the value of the pointer 504. Note that the ECP memory cells 502 can also be implemented with m-on-n groups of memory cells, to reduce the issue of resistance drift errors for the storage of the ECP pointer 504. Different values of the pointer 504 point to different ones of the data memory groups. A predefined value stored in the ECP memory cells 502 can indicate that there is no faulty data memory group to replace. In the example of FIG. 5, the identified faulty data memory group 510 is replaced with a spare memory group 506.

Figure 6:
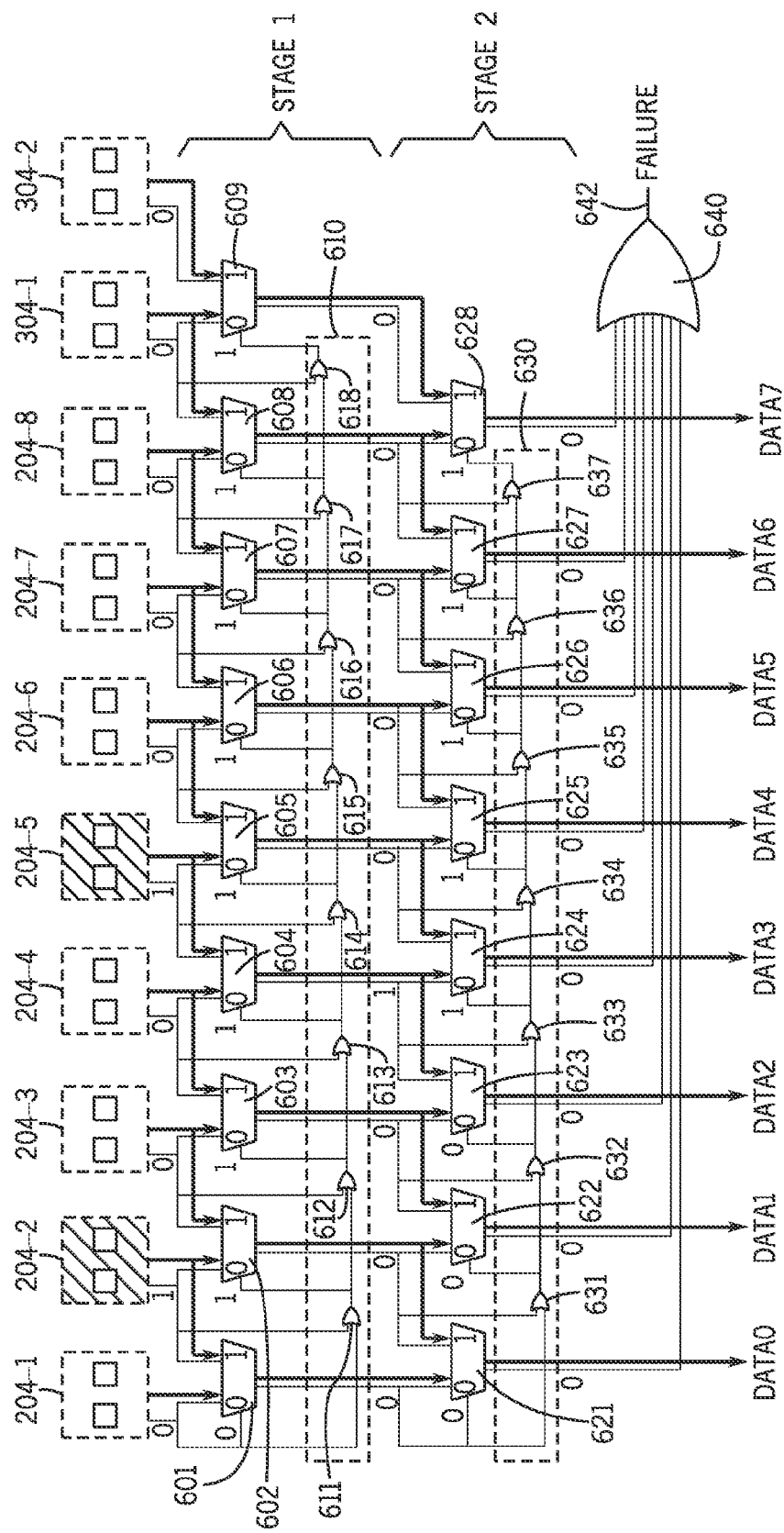
FIG. 6 is a schematic diagram of circuitry usable to select multilevel memory cells according to some implementations.

FIG. 6 is a schematic diagram illustrating how to perform hard error correction using spare memory cells, assuming the example shown in FIGS. 3A and 3B. To tolerate p (p≥1) hard failures, p correction stages are employed. In the example of FIG. 6, it is assumed that p=2. In FIG. 6, eight groups 204-1 to 204-8 of data memory cells are used, and two spare memory cells 304-1 and 304-2 are provided. It is assumed that memory groups 204-2 and 204-5 are faulty memory groups that are to be programmed to invalid states.

FIG. 6 shows two multiplexer stages: stage 1 and stage 2. The multiplexer stages constitute one example of steering circuitry to steer selected data bits from the memory cell groups 204-1 to 204-8 and 304-1 to 304-2 to an output. Each multiplexer in stage 1 has a first input connected to one memory group, and a second input connected to the output of the immediately following memory group in the sequence of FIG. 6. Stage 1 includes multiplexers 601, 602, 603, 604, 605, 606, 608, and 609. Stage 1 also includes control circuitry 610 that is used to provide control signals to select inputs of the multiplexer 601-609 to output from each multiplexer. The control circuitry 610 includes control gate 611, 612, 613, 614, 615, 616, 617, and 618, which can be OR gates, in some examples.

The multiplexer 601 has its first input connected to memory group 204-1 and its second input connected to memory group 204-2. Another multiplexer 604 has its first input connected to memory group 204-8 and its second input connected to the spare memory group 304-1.

Each memory group 204-1 to 204-8 and 304-1 to 304-2 can output an invalid indicator that can be set to a "1" value or a "0" value. In some examples, if set to a "1" value, the invalid indicator indicates that the respective memory group has been marked to have an invalid state (e.g. S4, S4). In the example of FIG. 6, the status indicators output from memory groups 204-2 and 204-5 are set to the "1" value. On the other hand, if a memory group is not marked with the invalid state (S4, S4), then it outputs an invalid indicator having a "0" value, which is the case with memory groups 204-1, 204-3, 204-4, and 204-6 to 204-7 and 304-1 to 304-2.

In FIG. 6, thin lines represented control signal paths, such as to propagate the status indicators, while bolded lines represent data paths.

The select input of each multiplexer in stage 1 is based on the invalid indicators of respective memory groups. The first multiplexer 601 in stage 1 has its select input connected to the invalid indicator of the memory group 204-1. Thus, if the memory group 204-1 is not at the invalid state, then the first input of the multiplexer 602 is selected for output by the multiplexer 602.

The remaining multiplexers in stage 1 have their select inputs connected to outputs of respective OR gates 611 to 618, where each OR gate has one input connected to the invalid indicator output by one memory group, and a second input connected to the invalid indicator output by an immediately previous memory group in the sequence shown in FIG. 6.

In the example of FIG. 6, since the memory group 204-2 is marked invalid, it outputs an invalid indicator of having a "1" value, which causes the OR gate 611 to output a logical "1" value to the select input of the multiplexer 602. This causes the multiplexer 602 to select its second input for output by the multiplexer 602. Effectively, the faulty memory group 204-2 is bypassed, since the multiplexer 601 selects the memory group 204-1, and the next multiplexer 602 in stage 1 selects the memory group 204-3.

Note that the OR gates in the control circuitry 610 are connected in a chain, with the output of one OR gate connected to the input of the next successive OR gate in the chain. The effect of this is that if a previous OR gate in the chain outputs a "1" value, that causes all subsequent OR gates in the chain to also output a "1" value, which effectively causes the corresponding multiplexers controlled by these successive OR gates to select the second inputs of the multiplexers.

In the example of FIG. 1, since the OR gate 611 has output a "1" value, all successive or OR gates 612-618 would also output a "1" value. What this means is that the multiplexer 604 in stage 1 will select the output of the faulty memory group 204-5, which means that the output of the faulty memory group 204-5 would be propagated to stage 2. To address this issue, stage 2 includes multiplexers 621 to 628, and a similar chain of OR gates 631-637 in control circuitry 630. The multiplexers in stage 2 cause bypassing of the output of the memory group 204-5, based on the OR gate 633 in the control circuitry 630 of stage 2 outputting the value "1" to bypass the output of the faulty memory group 204-5 that was selected by the multiplexer 604 in stage 1.

An OR gate 640 receives status indicators output by the multiplexers 621-628. If any of the status indicators has a "1" value, then the OR gate 640 outputs a failure indication 642. If none of the memory groups 204-1 to 204-8 and 304-1 to 304-2 is faulty, then the status indicators output by the multiplexer 621 to 628 would all have a "0" value which would mean that the OR gate 640 would not output the failure indication 642.

The multiplexers 621-628 of stage 2 output 8 data bits (Data 0-7).

Figure 7A:
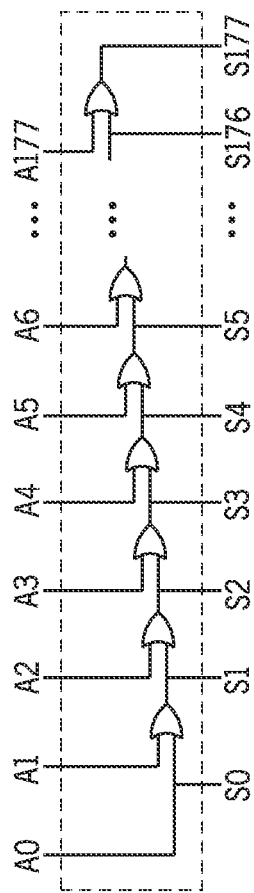
FIGS. 7A-7B are schematic diagrams of steering circuitry for selecting multilevel memory cells, according to further implementations.
Figure 7B:
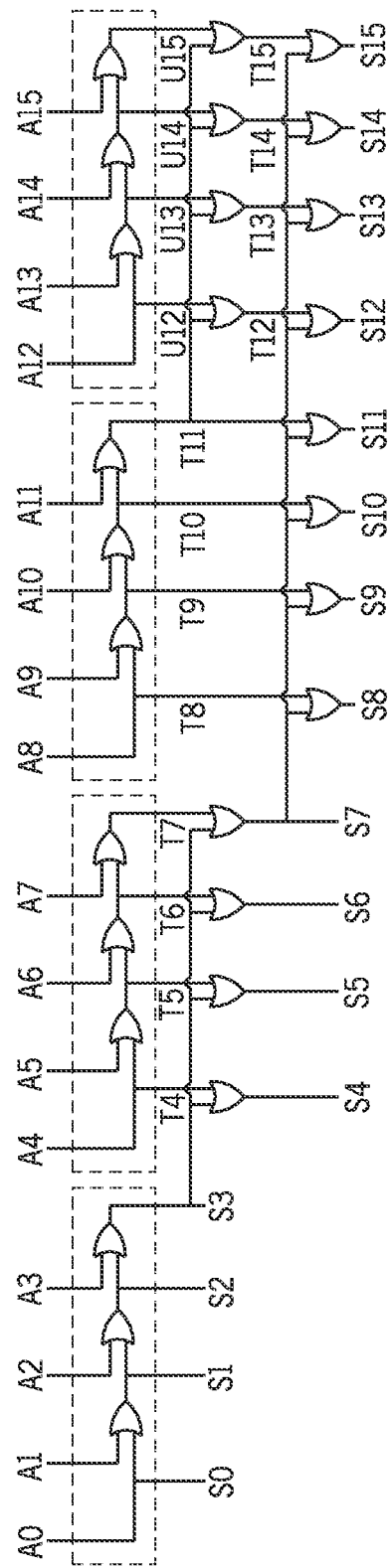

An issue associated with using the OR gate chains in stages 1 and 2 in FIG. 6 is that a relatively long OR-gate chain may take a relatively long time to evaluate. Thus, in some examples, instead of using a sequential OR gate chain as depicted in FIG. 7A, an OR gate chain that has a faster evaluation time can be used, such as depicted in FIG. 7B. The OR gate chain of FIG. 7B is a Skalansky-adder-style OR gate chain. In other examples, other types of OR gate chains can be employed, such as a Kogge-Stone-adder-style OR gate chain, and others.

Figure 8:
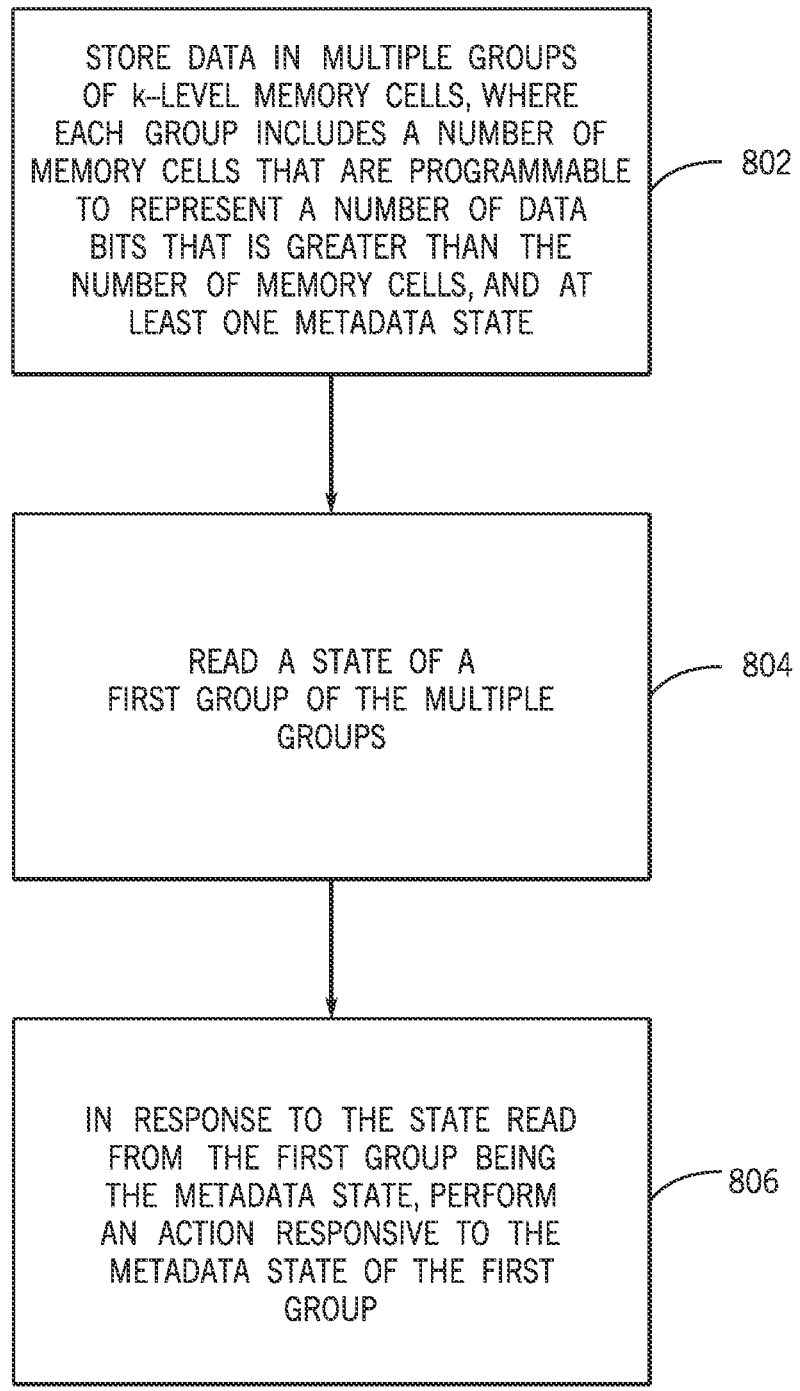
FIG. 8 is a flow diagram of a process according to some implementations.

FIG. 8 is a flow diagram of a general process according to some implementations. The process of FIG. 8 can be performed by a memory device that employs groups of k-level memory cells, as discussed above. The process stores (at 802) data in the groups of k-level memory cells, where each group of the k-level memory cells has k programmable states represented by respective resistance levels, and where each of the groups includes a number of memory cells that are programmable to represent: (1) a number of data bits that is greater than the number of cells, and (2) at least one metadata state.

The process further reads (at 804) a state of a first group of the multiple groups of memory cells. In response to the state read from the first group being the metadata state, an action responsive to the metadata state of the first group is performed (at 806). For example, as noted above, the metadata state can be an invalid state. The action performed in response to the invalid state of the first group can include marking the first group as invalid, and replacing the first group using a spare group of memory cells. In other examples, other actions can be performed in response to the first group having the metadata state.

In alternative implementations, two-layer encoding can be performed. With the two-layering coding implementations, a three-level memory cell can store data in a first layer and data in a second layer. An example of a two-layer encoding arrangement is depicted in the table below:

| Cell state | First layer bit | Second layer bit |
| --- | --- | --- |
| S1 | 0 | N/A |
| S2 | 1 | 0 |
| S4 |  | 1 |

Figure 9A:
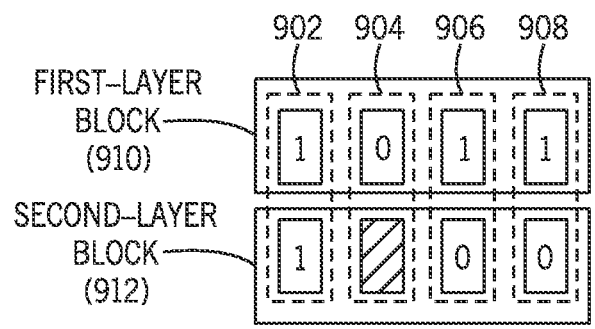
FIGS. 9A-9B are schematic diagrams of blocks of memory cells for storing data in multiple layers, according to further implementations.

FIG. 9A depicts four 3-level memory cells 902, 904, 906, and 908. The four memory cells 902, 904, 906, and 908 can store data in two layers, including a first-layer block 910 and a second-layer block 912. Each of the memory cells 902, 904, 906, and 908 is a three-level memory cell.

Each memory cell in the first-layer block 910 can store a one-bit data, which can have a logical 0 or 1 state. In the first-layer block 910, the S1 state represents logical "0," while either the S2 or S4 state represents logical "1" (as represented in the table above). In the example of FIG. 9A, in the first-layer block 910, the memory cells 902, 904, 906, and 908 store the following data: 1011.

A given memory cell stores a data bit in the second-layer block 912 only if the given memory cell stores a "1" (either the S2 or S4 state) in the first-layer block 910. If the given memory cell stores a "1" value in the first-layer block 910, then the given memory cell can store a logical "0" or "1" value in the second-layer block 912, where S2 represents "0" and S4 represents "1" in the second layer (according to the table above). Thus, in the example of FIG. 9A, because each of the memory cells 902, 906, and 908 stores a "1" value in the first-layer block 910, the corresponding memory cell also stores a data bit in the second-layer block 912. However, because the memory cell 904 stores a "0" value in the first-layer block 910, the memory cell 904 would not store any valid data in the second-layer block 912.

To increase the effective number of data bits stored per memory cell, it would be desirable to store a second-layer data bit in at least half the memory cells. The existence of a second-layer data bit, however, depends on the value of the first-layer data bit, which is not known ahead of time. While M first-layer bits can be stored in M memory cells, it is unclear how many second-layer bits can be stored in M.

Figure 9B:
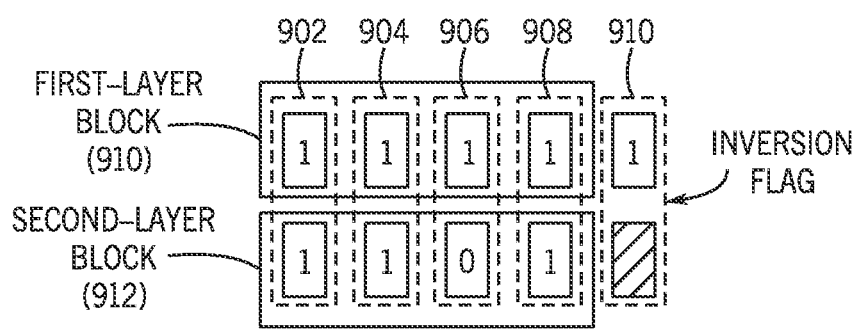

In one example, if the memory cells 902, 904, 906, and 908 of FIG. 9A store the value 0000 in the first-layer block 910, then that would mean that the memory cells 902, 904, 906, and 908 would not store any data in the second-layer block 912. To address the foregoing issue, data inversion can be applied in the first-layer block 910 to increase the number of "1"s stored by the first-layer block 910. For example, FIG. 9B shows the content of the memory cells 902, 904, 906, and 908 in the first-layer block 910 after data inversion has been applied, in an example where the memory cells 902, 904, 906, and 908 originally are to store 0000. After applying data inversion, these memory cells now store 1111, which maximizes the number of "1"s stored in the first-layer block 910 by the memory cells 902, 904, 906, and 908. A memory cell 910 can be used to store an inversion flag. If the inversion flag has a "1" value, that is an indication that the data in the first-layer block 910 has been inverted. However, if the inversion flag stored in the memory cell 910 has a "0" value, then that indicates that the data in the first-layer block 910 stored by the memory cells 902, 904, 906, and 908 has not been inverted.

Inverting the data in the first-layer block 910 from 0000 to 1111 allows the second-layer block 912 to store data, which in the example of FIG. 9B includes 1101.

With selective data inversion, at least half the number of bits in the first-layer block can be converted to "1"s, so that the second-layer block can store between M/2 to M second layer data bits in M cells. Note that the storage overhead of the selective inversion flag is relatively low—one inversion flag can be provided per block of data (of a specified size).

While a hard failure of a memory cell affects both the first-layer and second-layer information, drift errors behave differently in the two layers. As discussed above, the drift rate of the lowest resistance state (S1) is relatively low, and thus drift errors are unlikely to occur for state S1. When reading a first-layer bit, state S1 represents "0" while the remaining states (S2 and S4) represent logical "1". Since the drift rate for state S2 would not affect the storage of data in the first-layer block, and since state S1 has a relatively low drift rate, drift error is unlikely to occur for a first-layer bit. However, drift error may occur for the second-layer bit, since state S2 is used for storing logical "0" and state S2 is associated with a higher resistance drift rate.

Figure 10:
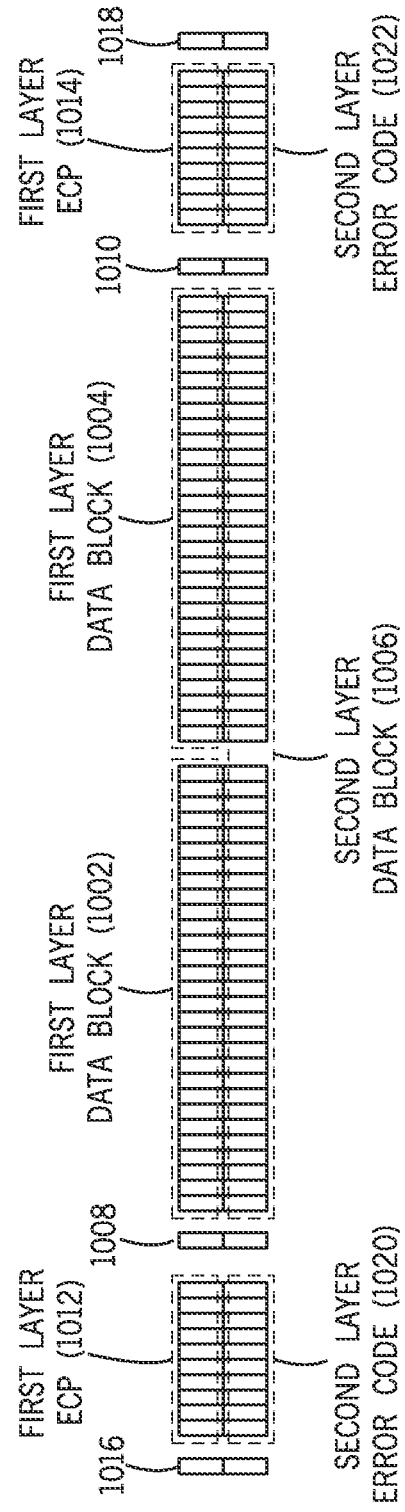
FIG. 10 is a schematic diagram of an example arrangement for storing data in multiple layers, according to additional implementations.

FIG. 10 shows an example arrangement in which data is stored in two layers. Two first layer data blocks 1002 and 1004 are depicted, where each data block 1002 and 1004 is of a specified size (e.g. 64 bytes). A second layer data block 1006 can store at least data of the specified size (e.g. 64 bytes). The first layer data block 1002 is associated with an inversion flag 1008, and the first layer data block 1004 is associated with an inversion flag 1010. The inversion flag 1008 or 1010 when set to a "1" value indicates that the data in the respective first layer data block 1002 or 1004 has been inverted.

Each first layer data block 1002 or 1004 includes a first layer ECP 1012 or 1014, respectively. The first layer ECP 1012 includes a pointer to a memory cell that has experienced a hard error, such that the memory cell can be replaced, as discussed in connection with FIG. 5 above. Similarly, the first layer ECP 1014 contains a pointer to a memory cell in the first layer data block 1004 that has experienced a hard error.

Each of the first layer ECP 1012 and 1014 is also associated with a respective inversion flag 1016 or 1018 to indicate whether or not the respective ECP 1012 or 1014 has been inverted.

In the second layer, the memory cells used to store the first layer ECP 1012 and first layer ECP 1014 can be used to store a second layer error code 1020 to perform error correction of data in the second layer data block 1006. Similarly, the memory cells used for storing the first layer ECP 1014 can be used to store a second layer error code 1022.

The latency of reading a first-layer block 1002 or 1004 is relatively low. The only post-processing that may have to be performed is hard error correction using ECP.

Reading a second-layer data block involves the following: (i) read the memory array (this is slower than the first-layer read); (ii) correct hard errors using the first-layer ECP (note that the first-layer data has to be read first before reading the second-layer data); (iii) extract the second-layer bits using the first-layer bits; and (iv) correct soft errors using an error correction code.

Extracting the second-layer bits can be implemented using steering circuitry similar to the FIG. 6 steering circuitry. To reduce the complexity of the steering circuitry, selective data inversion can be applied at a finer granularity, by associating an inversion flag with a first layer data block having reduced size.

In the foregoing description, numerous details are set forth to provide an understanding of the subject disclosed herein. However, implementations may be practiced without some or all of these details. Other implementations may include modifications and variations from the details discussed above. It is intended that the appended claims cover such modifications and variations.

What is claimed is:

1. A memory device comprising:
    a plurality of groups of k-level memory cells, where k>2, and where each of the k-level memory cells has k programmable states represented by respective resistance levels, the resistance levels including a lowest resistance level, an intermediate resistance level, and a highest resistance level, the intermediate resistance level being closer to the lowest resistance level than to the highest resistance level, wherein each of the groups includes a number of cells that are programmable to represent:
    data having a number of bits that is greater than the number of cells, and
    at least one metadata state.

2. The memory device of claim 1, wherein the metadata state indicates that the corresponding group of memory cells does not contain valid data.

3. The memory device of claim 1, wherein the metadata state relates to a data cache status.

4. The memory device of claim 1, wherein at least one of the plurality of groups of memory cells is initially designated as a spare group, and wherein the spare group is useable to replace a particular one of the plurality of groups that has been programmed to represent the metadata state.

5. The memory device of claim 4, further comprising at least one stage of multiplexers to bypass the particular group and to select the spare group for output.

6. The memory device of claim 4, wherein the spare group is useable to address a hard error, and wherein the memory device is to apply soft error correction prior to performing hard error correction using the spare group.

7. The memory device of claim 1, further comprising memory cells to store a value for a pointer that points to a faulty group of memory cells.

8. The memory device of claim 1, wherein the k programmable states include a given state represented by a highest resistance level of a memory cell, and wherein the metadata state is represented by the memory cells in a particular one of the groups both being at the given state.

9. A method comprising:
storing data in a plurality of groups of k-level memory cells, where k>2, and where each of the k-level memory cells has k programmable states represented by respective resistance levels, wherein each of the groups includes a number of memory cells that are programmable to represent a number of data bits that is greater than the number of memory cells, and at least one metadata state;
reading a state of a first group of the plurality of groups; and
in response to the state read from the first group being the metadata state, performing an action responsive to the metadata state of the first group.

10. The method of claim 9, wherein performing the action comprises marking the first group as invalid.

11. The method of claim 10, wherein performing the action further comprises replacing the first group with a spare group of memory cells.

12. A memory device comprising:
a block of k-level memory cells, where k>2, and where each of the k-level memory cells has k programmable states represented by respective resistance levels, and
wherein the block of k-level memory cells is arranged to store data in a first layer and a second layer, and wherein a given one of the memory cells stores a data bit in the second layer in response to the given memory cell storing a first data value in the first layer, and the given memory cell does not store any valid data in the second layer in response to the given memory cell storing a second, different value in the first layer.

13. The memory device of claim 12, further comprising a memory cell to store an inversion flag to indicate that data stored in the block of memory cells in the first layer has been inverted.

14. The memory device of claim 12, wherein in the first layer, a given one of the memory cells stores a data bit using at least a first of the k programmable states to represent a first data value, and a second of the k programmable states to represent a second data value, and wherein in the second layer, the given memory cell stores another data bit using at least one of the k programmable states to represent a first data value, and at least another of the k programmable states to represent a second data value.

15. The memory device of claim 1, wherein the metadata state indicates that the corresponding group of memory cells includes faulty memory cells.

16. The memory device of claim 1, wherein each of the groups includes a number of cells that are programmable to represent a plurality of metadata states.

17. The memory device of claim 1, wherein at least one of the plurality of groups of memory cells is programmable to an invalid state in response to a fault being detected in at least one memory cell of the group.

18. The memory device of claim 12, wherein the block of k-level memory cells includes a first layer error correcting pointer.

19. The memory device of claim 18, wherein the error correcting pointer includes a pointer to a memory cell among the block of k-level memory cells having a hard error.

* * * * *